United States Patent
Patti et al.

(10) Patent No.: US 8,519,546 B2
(45) Date of Patent: Aug. 27, 2013

(54) STACKED MULTI-DIE ELECTRONIC DEVICE WITH INTERPOSED ELECTRICALLY CONDUCTIVE STRAP

(75) Inventors: Davide Giuseppe Patti, Mascalucia (IT); Agatino Minotti, Mascalucia (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/369,803

(22) Filed: Feb. 9, 2012

(65) Prior Publication Data
US 2012/0217655 A1 Aug. 30, 2012

(30) Foreign Application Priority Data
Feb. 24, 2011 (IT) .............................. MI2011A0276

(51) Int. Cl.
*H01L 23/52* (2006.01)
*H01L 23/495* (2006.01)

(52) U.S. Cl.
USPC ............ 257/777; 257/E23.141; 257/E23.083; 257/693; 257/666; 257/676; 257/696; 257/698; 257/692; 257/690; 257/691; 257/786; 257/784

(58) Field of Classification Search
USPC .................. 257/693, E23.083, 666, 676, 696, 257/698, 692, 690, 691, 786, 784, 777, E23.141
See application file for complete search history.

(56) References Cited

U.S. PATENT DOCUMENTS

| 2001/0052641 | A1 | 12/2001 | Kuo et al. | |
|---|---|---|---|---|
| 2005/0275082 | A1* | 12/2005 | Ferrara et al. | 257/691 |
| 2008/0061396 | A1 | 3/2008 | Havanur | |
| 2009/0212405 | A1 | 8/2009 | Liu et al. | |
| 2011/0260314 | A1* | 10/2011 | Minotti | 257/693 |

FOREIGN PATENT DOCUMENTS

| JP | 2930079 B1 | 8/1999 |
|---|---|---|
| JP | 2000-58744 | * 2/2000 |

OTHER PUBLICATIONS

Italian Search Report and Written Opinion for MI2011A000276 mailed Oct. 18, 2011 (8 pages).

* cited by examiner

*Primary Examiner* — A O Williams
(74) *Attorney, Agent, or Firm* — Gardere Wynne Sewell LLP

(57) ABSTRACT

An electronic device includes a first semi-conductor die, a second semi-conductor die and an electrically conductive element. The electrically conductive element includes a first electrically conductive part interposed at least partially between the first semi-conductor die and the second semi-conductor die, wherein said first part is electrically coupled to the first semi-conductor die. The electrically conductive element further includes a second electrically conductive part electrically coupled to the first part, wherein said second part extends from at least part of the first part. The first part is an electrically conductive strap between the dice, and the second part is clip extending from at least part of the strap.

20 Claims, 3 Drawing Sheets

STACKED MULTI-DIE ELECTRONIC DEVICE WITH INTERPOSED ELECTRICALLY CONDUCTIVE STRAP

PRIORITY CLAIM

This application claims priority from Italian Application for Patent No. MI2011A000276 filed Feb. 24, 2011, the disclosure of which is hereby incorporated by reference.

FIELD OF THE INVENTION

The present invention generally refers to the electronics field. More specifically, the present invention relates to an electronic device implemented on an integrated circuit for high power applications.

BACKGROUND

Electronic devices are implemented on integrated circuits by means of a semi-conductor material die, for example silicon. The semi-conductor die is mounted on and fixed to a metal support, for example with a solder paste. Pads are implemented on the semi-conductor die and are connected to the external pins (also known as leads) of the integrated circuit by means of electrical connections implemented by wires (known as "wire bonding"), clips or ribbons: in this way the semi-conductor die is connected to the external pins. Finally, the semi-conductor die, the metal support, the wires (or clips or ribbons) and part of the pins are encapsulated into a package for protecting the integrated circuit from the external environment.

A known prior art for integrated circuits for high power applications uses a first die implementing the high power functionalities and a second die implementing the control functionalities, wherein the second die is mounted on the first die, for example with a solder paste. The high power functionalities are, for example, the source or drain terminals of a MOSFET or JFET transistor, or the collector or emitter terminals of a bipolar transistor. The control functionalities are, for example, the gate terminal of a MOSFET or JFET transistor or the base terminal of a bipolar transistor.

In the prior art the high power die is connected to the external pins by means of wires, clips, or ribbons, which carry an high current (for example, the current between source and drain of a MOSFET can have values of about 100 A). Applicant has observed that a drawback of the prior art is that the electrical connection between the high power die and the external pins has a low efficiency from a point of view of the electrical and thermal performance; moreover it requires to use suitable arrangements to allow to carry the high current, such as for example an high number of wires, clips or ribbons, thus increasing the size occupied by the integrated circuit.

SUMMARY

An electronic device comprises: a first semi-conductor die; a second semi-conductor die; an electrically conductive element including: a first electrically conductive part (3) interposed at least partially between the first semi-conductor die and the second semi-conductor die, wherein said first part is electrically coupled to the first semi-conductor die (2), a second electrically conductive part (11, 12) electrically coupled to the first part, wherein said second part extends from at least part of the first part.

The electronic device according to the embodiments has the following advantages: it can improve the efficiency of the electrical connection towards the semi-conductor die; it can reduce the number of clips used for connecting the semi-conductor die; it can reduce the number of pads used on the semi-conductor die; and it allows a better dissipation of the heat generated by the semi-conductor die.

BRIEF DESCRIPTION OF THE DRAWINGS

Further characteristics and advantages of the invention will be understood from the following description of a preferred embodiment and its variants provided as an example with reference to the attached drawings, wherein.

DETAILED DESCRIPTION OF THE DRAWINGS

Figure 1:
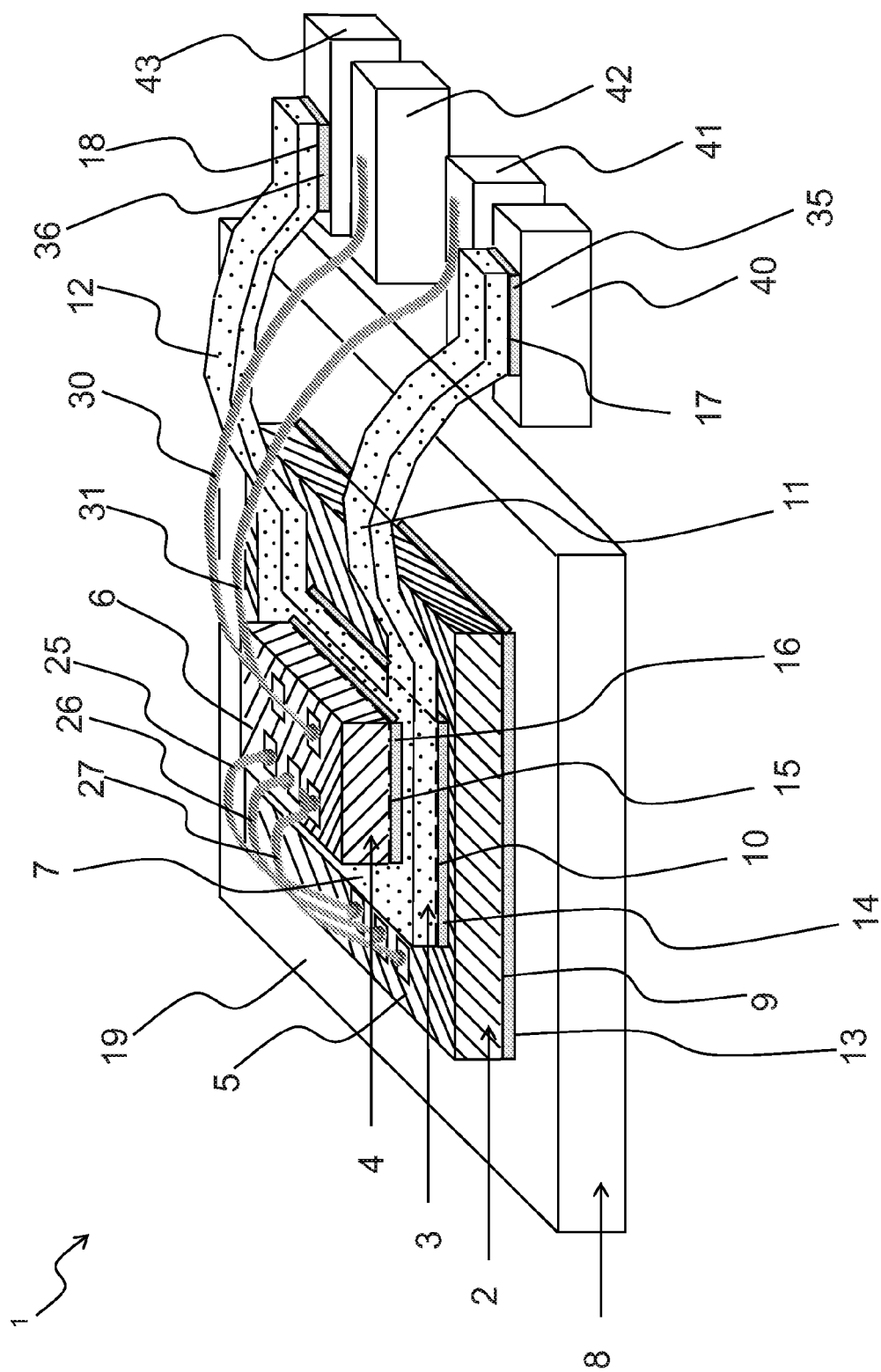
FIG. 1 schematically shows an electronic device according to a first embodiment of the invention.

With reference to FIG. 1, there is shown an electronic device according to a first embodiment. The electronic device 1 can be a part of an integrated circuit comprising a plurality of electronic devices or it can be a single electronic device (for example, a MOSFET or JFET transistor or a bipolar junction transistor).

The electronic device 1 comprises a first die of a semi-conductor material 2 (for example, silicon), including an electrically conductive element 3, 11, 12, and comprises a second die of semi-conductor material 4 (for example, silicon). Preferably, the electrically conductive element is made of metal, for example copper.

The electrically conductive element comprises a first electrically conductive part 3 interposed at least partially between the first semi-conductor die 2 and the second semi-conductor die 4, wherein the first part 3 of the electrically conductive element is electrically coupled to the first semi-conductor die 2; this first part 3 allows to improve the electrical connection between the first semi-conductor die 2 and the pins 40, 43, as will be explained more in detail afterwards. Preferably, the second semi-conductor die 4 is physically connected to the first part 3 of the electrically conductive element; for example, the second semi-conductor die 4 is mounted on the first part 3 of the electrically conductive element, as shown in FIG. 1. Analogously, the first part 3 of the electrically conductive element is physically connected to the first semi-conductor die 2; for example, the first part 3 of the electrically conductive element is mounted on the first semi-conductor die 2, as shown in FIG. 1.

The electrically conductive element further comprises a second electrically conductive part 11, 12 electrically coupled to the first part 3, so that the second part extends from at least part of the first part 3: this second part allows to improve the electrical connection between the first semi-conductor die 2 towards the pins 40, 43, as will be explained more in detail afterwards.

Preferably, the electrically conductive element 6 is a single pre-formed piece, which is welded on the first semi-conductor die 2.

Advantageously, referring particularly to FIG. 1, the first part 3 of the electrically conductive element is an electrically conductive strap 3 defined by an upper surface 7 and by a lower surface 10 (a portion of the latter is indicated in FIG. 1 by a dashed line); preferably, the upper surface 7 and the lower surface 10 are substantially flat and substantially parallel each other (that is the thickness of strap 3 is substantially constant) and the shape of strap 3 is substantially constant, as shown in FIG. 1.

Moreover, the first semi-conductor die 2 is defined by an upper surface 5 and by a lower surface 9; preferably, the upper surface 5 and the lower surface 9 are substantially flat and substantially parallel each other (that is, the thickness is substantially constant).

Moreover, the second semi-conductor die 4 is defined by a lower surface 15 (a first part of the latter is indicated in FIG. 1 by a dashed and dotted line) and by an upper surface 6; preferably, the upper surface 6 and the lower surface 15 are substantially flat and substantially parallel each other (that is the thickness is substantially constant).

The lower surface 10 of the strap 3 overlaps (fully or partially) the upper surface 5 of the first semi-conductor die 2 (as shown in FIG. 1), such to electrically couple the first semi-conductor die 2 to the strap 3; this overlapping surface allows to have a greater surface for electrically connecting the first semi-conductor die 2 towards the pins 40, 43. Advantageously, the electrical coupling between the first semi-conductor die 2 and the first part 3 of the electrically conductive element is implemented by an electrically conductive double-sided adhesive layer 14 (for example, by an epoxy resin) interposed between the lower surface 10 of the strap 3 and the upper surface 5 of the first semi-conductor die 2, implementing both the electrical connection and the physical connection between the strap 3 and first semi-conductor die 2, as shown in FIG. 1. Alternatively, the electrical coupling between the strap 3 and the first semi-conductor die 2 is implemented by an electrically conductive solder paste implementing also the physical connection between them.

It has to be observed that FIG. 1, for the sake of simplicity, shows that the lower surface 10 of the strap 3 fully overlaps the upper surface 5 of the first semi-conductor die 2, but it is also possible a partial overlap of the lower surface 10 with the upper surface 5; moreover, it is also possible that the lower surface 10 partially extends externally to the upper surface 5 of the first semi-conductor die 2.

Advantageously, the second part of the electrically conductive element comprises at least one clip 11, 12 extending from at least part of the strap 3; for example, FIG. 1 shows two clips 11, 12 extending to the ends of a side of the lower surface 10 and of the upper surface 7. The clips 11, 12 connected to the strap 3 allow to improve the electrical connection of the first semi-conductor die 2 with the pins 40, 43.

Preferably, the lower (and upper) surface of the clip 11 has a shape which is substantially an arc ending with a lower surface 17 having a substantially flat shape; analogously, the lower (and upper) surface of the clip 12 has a shape which is substantially an arc ending with a surface 18 having a substantially flat shape.

The lower surface 15 of the second semi-conductor die 4 overlaps (fully or partially) the upper surface 7 of the strap 3, such to implement a physical connection between the strap 3 and the second semi-conductor die 4, as shown in FIG. 1.

The second semi-conductor die 4 can be electrically isolated from the electrically conductive element, or it can be electrically coupled to the electrically conductive element. In the first case there is a non electrically conductive adhesive resin 16 interposed between the lower surface 15 of the second semi-conductor die 4 and the upper surface 7 of the strap 3, implementing the physical connection between the second semi-conductor die 4 and the strap 3. In the second case there is an electrically conductive double-sided adhesive layer 16 (for example, an epoxy resin) interposed between the lower surface 15 of the second semi-conductor die 4 and the upper surface 7 of the strap 3, implementing both the electrical and physical connection between the second semi-conductor die 4 and the strap 3.

It has to be observed that, for the sake of simplicity, FIG. 1 shows the case wherein the whole lower surface 15 of the second semi-conductor die 4 overlaps the upper surface 7 of the strap 3, but the invention can be applied also to the case wherein the lower surface 15 of the second semi-conductor die 4 partially overlaps the upper surface 7 of the strap 3 and partially extends externally to the upper surface 7 of the strap 3.

Preferably, the part overlapping the lower surface 15 of the second semi-conductor die 4 is substantially stacked with the part overlapping the lower surface 10 of the strap 3, as shown in FIG. 1.

The electronic device 1 further comprises a metal support 8 (commonly known as "slug"). The first semi-conductor die 2 is physically connected to the metal support 8; for example, the first semi-conductor die 2 is mounted on the metal support 8. Specifically, the metal support 8 comprises an upper surface 19, and the lower surface 9 of the first semi-conductor die 2 overlaps (partially or fully) the upper surface 19 of the metal support 8, such to implement a physical connection between the metal support 8 and the first semi-conductor die 2. Preferably, the physical connection between the metal support 8 and the first semi-conductor die 2 is implemented by a double-sided adhesive electrically conductive layer 13 (or by an electrically conductive solder paste) interposed between the lower surface 9 of the first semi-conductor die 2 and the upper surface 19 of the metal support 8, such to implement both the physical connection and the electrical connection between the first semi-conductor die 2 and the metal support 8.

Advantageously, the first semi-conductor die 2 performs a high-power functionality and the second semi-conductor die 4 performs a control functionality of the first semi-conductor die 2, wherein the term "high-power" means that the first semi-conductor die 2 is capable of carrying high value current signals (for example between 1 A and 100 A); in this case the electrically conductive element allows to improve the efficiency of the electrical connection of the first high power semi-conductor die 2 towards the outside, by means of the strap 3 interposed between the first semi-conductor die 2 and the second semi-conductor die 4 and by means of the clips 11, 12 capable of carrying high current values (for example, between 1 A and 100 A). Moreover, the number of clips necessary for carrying high current values towards the outside is reduced (FIG. 1 shows for example only two clips 11, 12).

Alternatively, both the first semi-conductor die 2 and the second semi-conductor die 4 perform high-power functionalities.

The electronic device 1 further comprises at least one power pin 40, 43 for connecting externally the first semi-conductor die 2 which performs a high-power functionality wherein the term "power pin" means that is capable of carrying high value current signals (for example, between 1 A and 100 A). Clips 11, 12 of the electrically conductive element are electrically coupled to said power pins 40, 43: for example, FIG. 1 shows two power pins 40, 43 which are electrically connected to the clips 11, 12 respectively. In this case the presence of the strap 3 (interposed between the first semi-conductor die 2 and the second semi-conductor die 4) allows to reduce the number of clips necessary to carry high current values towards the power pins 40, 43 and, consequently, allows to reduce the number of power pins (FIG. 1 shows for example just two power pins 40, 43). Advantageously, the pins 40, 43 are the drain or source terminals of a MOSFET or JFET transistor or are the emitter or collector terminals of a bipolar transistor and the high value current signals (for example, between 1 A and 100 A) are the current between the source and drain of the MOSFET or JFET transistor or the current between the emitter and collector of the bipolar junction transistor.

Advantageously, the electrical connection between the clip 11 and the power pin 40 is implemented with an electrically conductive solder paste 35 (obtained with an ultrasonic welding process) interposed between the lower surface 17 of the clip 11 and the upper surface of the power pin 40, such to implement both the electrical connection and the physical connection between the clip 11 and the power pin 40. Analogously, the electrical coupling between the clip 12 and the power pin 43 is implemented with an electrically conductive solder paste 36 (obtained with an ultrasonic welding process) interposed between the surface 18 and the upper surface of the power pin 43, such to implement both the electrical connection and the physical connection between the clip 12 and the power pin 43.

Preferably, the electronic device 1 further comprises one or more electrically conductive internal control wires 25, 26, 27 for electrically connecting the first semiconductor die 2 to the second semiconductor die 4, by means of internal pads placed on the first semiconductor die 2 and on the second semiconductor die 4. For example, FIG. 1 shows three electrically conductive internal control wires 25, 26, 27, which are such to carry signals so that the second semiconductor die 4 can perform the control functions of the first semiconductor die 2, such as for example the control of the gate voltage of a MOSFET or JFET transistor or the control of the base current of a bipolar junction transistor.

Advantageously, in case the strap 3 is electrically connected to the second semiconductor die 4, it is possible to electrically connect the first semiconductor die 2 to the second semiconductor die 4 through the electrically conductive element. Therefore it is possible to perform the electrical connection between the first semiconductor die 2 and the second semiconductor die 4:

only by means of the electrically conductive internal control wires 25, 26, 27; or by means of the electrically conductive internal control wires 25, 26, 27 and by means of the electrically conductive element, with the advantage to allow to reduce the number of the electrically conductive internal control wires; or only by means of the electrically conductive element, with the advantage of eliminating the number of internal control wires.

Preferably, the electronic device 1 further comprises one or more control pins 41, 42 for connecting externally the second semiconductor die 4, wherein the term "control pins" means they are such to carry current signals having a low value (for example, smaller than 10 mA); moreover, the electronic device 1 comprises one or more electrically conductive external control wires 30, 31 for electrically coupling the second semi-conductor die 4 to the control pins 41, 42. For example, FIG. 1 shows two control pins 41, 42 which are electrically connected to the control wires 31, 30 respectively.

For the sake of simplicity, FIG. 1 shows the case wherein the surfaces 5, 9, 10, 7, 15, 6 are substantially flat, but the invention can be also applied to other types of surfaces which allow to have an electrically coupling between the first semiconductor die 2 and at least part of the strap 3 and, preferably, which allow to have an electrically coupling between the strap 3 and at least part of the second semiconductor die 4.

Preferably, the lower surface 10 of strap 3 overlaps the upper surface 5 of the first semi-conductor die 2 for a portion depending on the current value to be carried from the first semi-conductor die 2 towards the power pins 40, 43. Preferably, the width of the clip 11 (or 12) depends on the current value to be carried from the first semi-conductor die 2 to the power pins 40, 43.

According to a variant of the first embodiment (not shown in the figures), the electronic device comprises:

a metal layer 8 electrically insulated from the first semiconductor die 2;

the first semi-conductor die 2;

a plurality (at least two) of electrically conductive elements divided each other, having respective electrically conductive straps mounted on the first semi-conductor die 2 and electrically connected to the first semi-conductor die 2, each electrically conductive element comprising at least one respective clip electrically connected to the respective conductive straps;

the second semi-conductor die 4 mounted on the straps of the plurality of electrically conductive elements and which overlaps (partially or fully) the straps of the plurality of the electrically conductive elements.

Figure 2A:
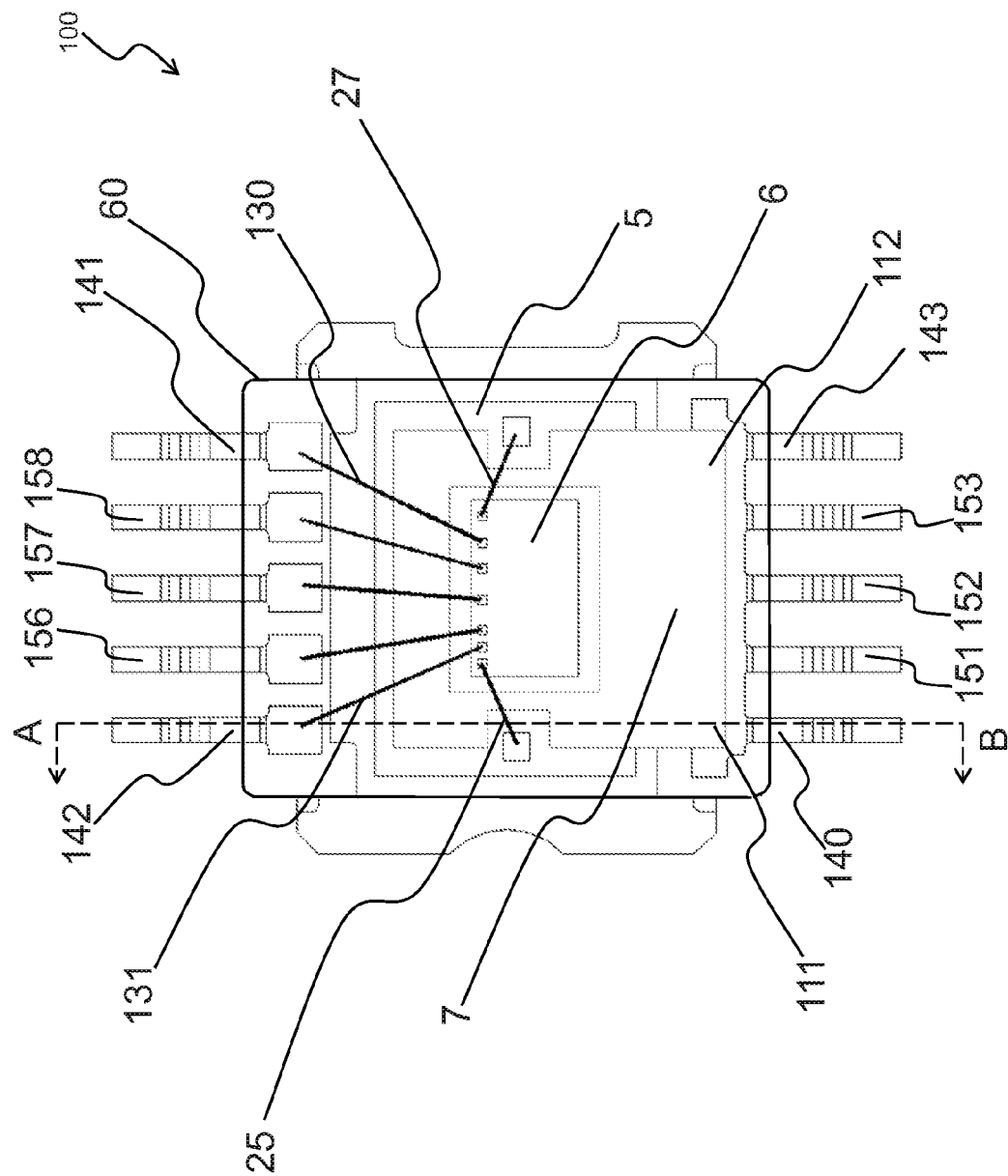
FIGS. 2A-2B schematically show a top and a cross-section view of a package encapsulating an electronic device according to a second embodiment of the invention.
Figure 2B:
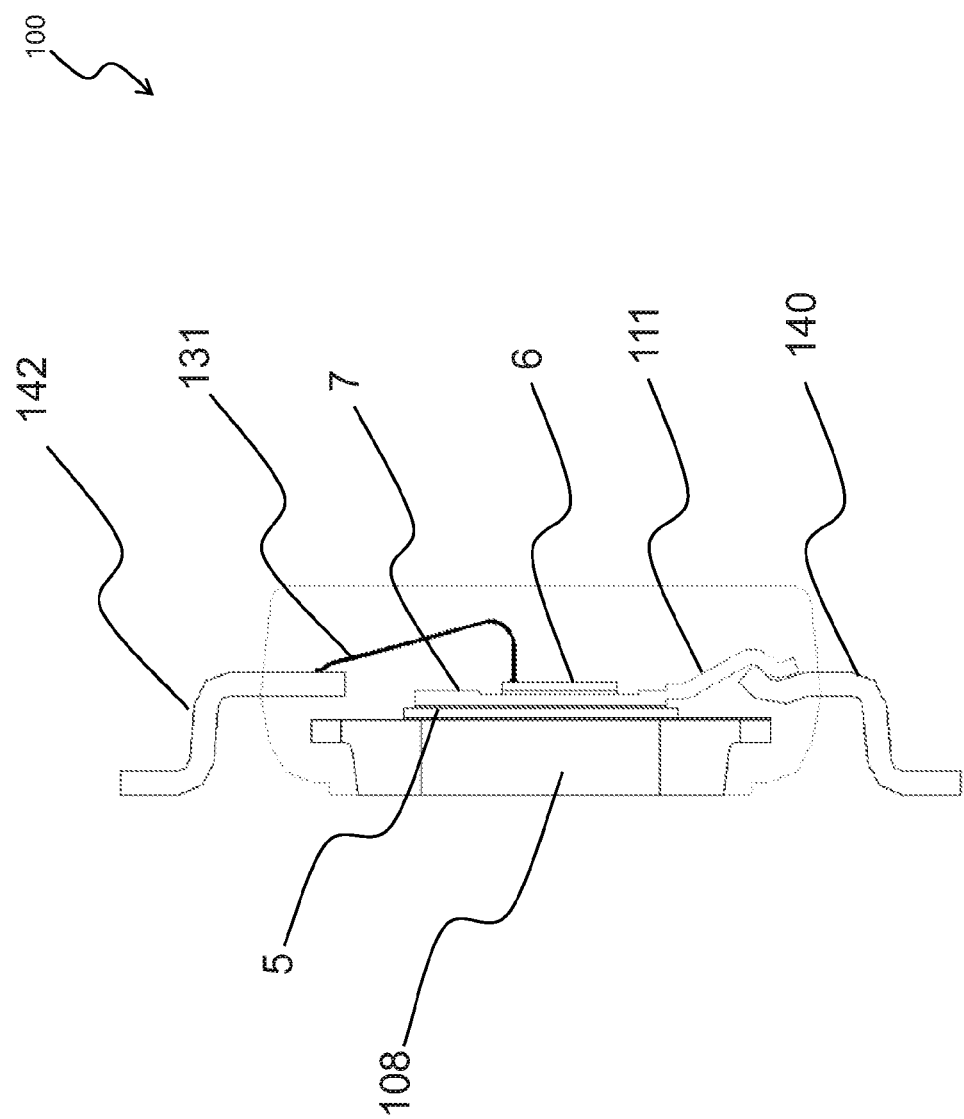

With reference to FIGS. 2A and 2B, it is schematically shown a top and a cross-section view of a package 100 encapsulating an electronic device according to a second embodiment. It has to be observed that in FIGS. 2A and 2B, components or elements identical or analogous to those of FIG. 1 have been indicated with the same reference numbers. The cross-section view of FIG. 2B has been obtained along the dashed line A-B of the top view of FIG. 2A.

The package 100 encapsulates an electronic device which can be a MOSFET or JFET transistor or a bipolar junction transistor; for the purpose of the explanation of the second embodiment, it is assumed that the electronic device is a MOSFET transistor.

The package 100 comprises an encapsulant material 60 made for example of plastic material having the function of protecting the electronic device from the external environment.

The package 100 further comprises one pin 108 which is the drain terminal of the MOSFET transistor, comprises the pins 140, 143, 151, 152, 153 which are the source terminals of the MOSFET transistor and comprises the pins 141, 142, 156, 157, 158 which are the gate terminals of the MOSFET transistor.

The package 100 comprises the first semi-conductor die 2 of which it is visible the upper surface 5, comprises the electrically conductive element of which it is visible the upper surface 7 of the strap 3 and of which it is visible in FIG. 2B the clip 111, and comprises the second semi-conductor die 4 of which it is visible the upper surface 6.

Clip 111 has a function analogous to the one of the clip 11 of the first embodiment (that is, it has the function of electrically connecting the first semiconductor die 2 to the external power pin 140), but it has a different geometric shape. For example, FIG. 2B shows that the surface of the clip 111 has a first portion wherein the shape is substantially flat, has a second portion wherein the shape is substantially flat and has an angle greater than 0 degree with respect to the first portion, and has a third portion wherein the shape is substantially flat and has an angle greater than 0 degree with respect to the second portion.

Pin 140 is electrically connected to the clip 111 and has a function similar to the one of the pin 40, but it has a different shape. Specifically, FIG. 2B shows that the surface of the pin 140 has a first portion wherein the shape is substantially flat, has a second portion wherein the shape is substantially flat and has an angle greater than 90 degrees with respect to the first portion, and has a third portion wherein the shape is substantially flat and has an angle greater than 90 degrees with respect to the second portion.

Wires 130, 131 have a function similar to the one of the wires 30, 31 of the first embodiment.

Pin 142 is electrically connected to the wire 131 and has a function similar to the one of the pin 42 of the first embodiment, but it has a different shape. Specifically, FIG. 2B shows that the surface of the pin 142 has a first portion wherein the shape is substantially flat, has a second portion wherein the shape is substantially flat and has an angle of about 90 degrees with respect to the first portion, and has a third portion wherein the shape is substantially flat and has an angle of about 90 degrees with respect to the second portion.

Pin 108 has a function similar to the one of the metal layer 8 of the first embodiment; moreover, pin 108 is electrically connected to the semi-conductor die 2, in order to allow a current flow between the drain terminal implemented by the pin 108 and the source terminals implemented by the pins 140, 143, 151, 152, 153.

What is claimed is:

1. An electronic device, comprising:
   a first semi-conductor die;
   a second semi-conductor die; and
   an electrically conductive element including:
      a strap part interposed at least partially between the first semi-conductor die and the second semi-conductor die, wherein said strap part is electrically coupled to the first semi-conductor die, and
      a clip part integral with the strap part and which extends away from the strap part;
   a pin member having an upper surface in electrical contact with a lower surface of the clip part of the electrically conductive element; and
   an encapsulant body which fully encapsulates the first semi-conductor die, second semi-conductor die and strap and clip parts of the electrically conductive element, said pin member extending outside of the encapsulant body.

2. The electronic device according to claim 1 wherein the strap part is defined by a first surface and by a second surface, and
   wherein the clip part extends away from the first surface and the second surface.

3. The electronic device according to claim 2, wherein the first semi-conductor die includes a first contact surface, and
   wherein the second surface of the strap part is electrically coupled to the first contact surface of the first semi-conductor die.

4. The electronic device according to claim 1, wherein the first semi-conductor die performs a high-power switching functionality and the second semi-conductor die performs a control functionality which controls switching performed by the first semi-conductor die.

5. The electronic device according to claim 1, wherein said pin member comprises a power pin for connecting externally to the first semi-conductor die.

6. The electronic device according to claim 2, wherein the second surface of the strap part overlaps the first contact surface of the first semi-conductor die, the device further comprising an electrically conductive layer interposed between the second surface and the first contact surface in order to perform an electrical and a physical connection between the second surface and the first contact surface.

7. The electronic device according to claim 6, wherein the second semi-conductor die includes a second contact surface overlapping the first surface of the strap part, the device further comprising another adhesive layer interposed between the second contact surface and the first surface for performing a physical connection between the second contact surface and the first surface.

8. The electronic device according to claim 7, wherein the another adhesive layer is electrically conductive, in order to perform an electrical connection between the strap and the second semi-conductor die.

9. The electronic device according to claim 1, further comprising a metal layer electrically coupled to an under surface of the first semi-conductor die, said metal layer having a bottom surface which is exposed outside of the encapculant body.

10. The electronic device according to claim 1, further comprising at least one electrically conductive internal control wire for connecting electrically the first semi-conductor die to the second semi-conductor die.

11. The electronic device according to claim 1, further comprising at least one control pin extending outside of the encapsulant body and including at least one electrically conductive control wire for connecting electrically the second semi-conductor die to the at least one control pin.

12. The electronic device according to claim 11, wherein the at least one clip part is connected to a terminal of a transistor selected from the group consisting of: a source terminal of a MOSFET; a drain terminal of a MOSFET; an emitter terminal of a bipolar junction transistor; a collector terminal of a bipolar junction transistor; and wherein the at least one control wire is electrically connected to a gate terminal of the MOSFET or to a base terminal of the bipolar junction transistor.

13. An electronic device, comprising:
   a first semi-conductor die;
   a second semi-conductor die;
   an encapsulating material surrounding the first semi-conductor die and second semi-conductor die;
   a pin member extending out from the encapsulating material; and
   an electrically conductive member including:
      a first part that is positioned between and attached to each of a top surface of the first semi-conductor die and a bottom surface of the second semi-conductor die and is electrically connected to at least one of the first semi-conductor die and second semi-conductor die; and
      a second part extending out away from the first semi-conductor die and configured to make electrical contact with a surface of the pin member.

14. The electronic device of claim 13, wherein the second part of the electrically conductive member has curved shape terminating in a surface contacting the surface of the pin member.

15. The electronic device of claim 13, wherein the second part of the electrically conductive member comprises a first substantially flat portion extending upwardly at a non-zero angle from the first part of the electrically conductive member and a second substantially flat portion extending downwardly at a non-zero angle from the first substantially flat portion.

16. The electronic device of claim 15, wherein a bottom surface of the second substantially flat portion contacts the surface which is an upper surface at the end of the pin member.

17. The electronic device of claim 15, wherein the second part of the electrically conductive member further comprises a third substantially flat portion extending upwardly at a non-zero angle from the second substantially flat portion.

18. The electronic device of claim 17, wherein a bottom surface of the second substantially flat portion and a bottom surface of third substantially flat portion both contact the surface which is an upper surface at the end of the pin member.

19. The electronic device according to claim 1, further comprising:
 a metal support connected to the first semi-conductor die and having a planar upper surface; and
 wherein the upper surface of the pin member is positioned above the planar upper surface of the metal support.

20. The electronic device according to claim 19, wherein said metal support has a planar bottom surface which is exposed outside of the encapculant body.

* * * * *